US007087900B2

(12) United States Patent
Iida et al.

(10) Patent No.: US 7,087,900 B2
(45) Date of Patent: *Aug. 8, 2006

(54) SOLID-STATE INFRARED IMAGER

(75) Inventors: Yoshinori Iida, Tokyo (JP); Keitaro Shigenaka, Hachioji (JP); Naoya Mashio, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/957,623

(22) Filed: Oct. 5, 2004

(65) Prior Publication Data

US 2005/0029454 A1   Feb. 10, 2005

Related U.S. Application Data

(62) Division of application No. 10/244,403, filed on Sep. 17, 2002, now Pat. No. 6,809,320.

(30) Foreign Application Priority Data

Sep. 26, 2001   (JP)   ............................. 2001-295106

(51) Int. Cl.
   *G01J 5/20*   (2006.01)
   *H01L 27/14*  (2006.01)
(52) U.S. Cl. .................................. 250/332; 250/338.4
(58) Field of Classification Search ............. 250/338.4, 250/339.03, 332, 330, 370.08, 370.01, 370.14
   See application file for complete search history.

(56) References Cited

U.S. PATENT DOCUMENTS

| 4,242,706 A | 12/1980 | McCormack et al. |
| 5,093,589 A | 3/1992 | Miyamoto et al. |
| 5,554,849 A | 9/1996 | Gates |
| 6,201,248 B1 | 3/2001 | Marion et al. |
| 6,211,520 B1 | 4/2001 | Ishikawa et al. |
| 6,300,632 B1 | 10/2001 | Liu et al. |

(Continued)

FOREIGN PATENT DOCUMENTS

JP   11-88770   3/1999

(Continued)

OTHER PUBLICATIONS

N. Nakamura, et al., The Journal of the Institute of Image Information and Television Engineers, vol. 54, No. 2, pp. 216-223, "Development of a Highly Sensitive CMOS Active Pixel Image Sensor," 2000.

Tomohiro Ishikawa, et al. "Low-cost 320×240 uncooled IRFPA using conventional silicon IC process," SPIE, vol. 3698, Apr. 1999, pp. 556-564.

(Continued)

*Primary Examiner*—Albert Gagliardi
(74) *Attorney, Agent, or Firm*—Oblon, Spivak, McClelland, Maier & Neustadt, P.C.

(57) ABSTRACT

A solid-state infrared imager comprises a matrix array of infrared sensing pixels which are formed as an imaging area on a semiconductor substrate and each of which contains a pn-junction thermoelectric converter element to sense incident infrared radiation, row selection lines each connected to the pixels of a corresponding row, signal lines each connected to the pixels of a corresponding column, a row selection circuit which selects and drives one of the row selection lines, and a signal readout circuit which reads out signal currents output to the signal lines from the pixels corresponding to the row selection line driven by the row selection circuit. Particularly, the signal readout circuit includes a signal line potential stabilizer which stabilizes the potential of the signal line to a constant level, and a current-voltage converter which converts the signal current flowing in a signal line to a signal voltage.

3 Claims, 12 Drawing Sheets

U.S. PATENT DOCUMENTS

| | | |
|---|---|---|
| 6,504,153 B1 | 1/2003 | Shigenaka et al. |
| 6,541,298 B1 | 4/2003 | Iida et al. |
| 6,730,909 B1 | 5/2004 | Butler |

FOREIGN PATENT DOCUMENTS

| | | |
|---|---|---|
| JP | 2001-255206 | 9/2001 |

OTHER PUBLICATIONS

X. Gu, et al. "On-chip compensation of self-heating effects in microbolometer infrared detector arrays," Sensors and Actuators A 69, 1998, pp. 92-96.

Kazuhiro Chiba, et al. "Low Noise Readout Circuit for Uncooled Infrared Focal Plan Array," ITE Technical Report, vol. 24, No. 17, Feb. 2000, pp. 13-18.

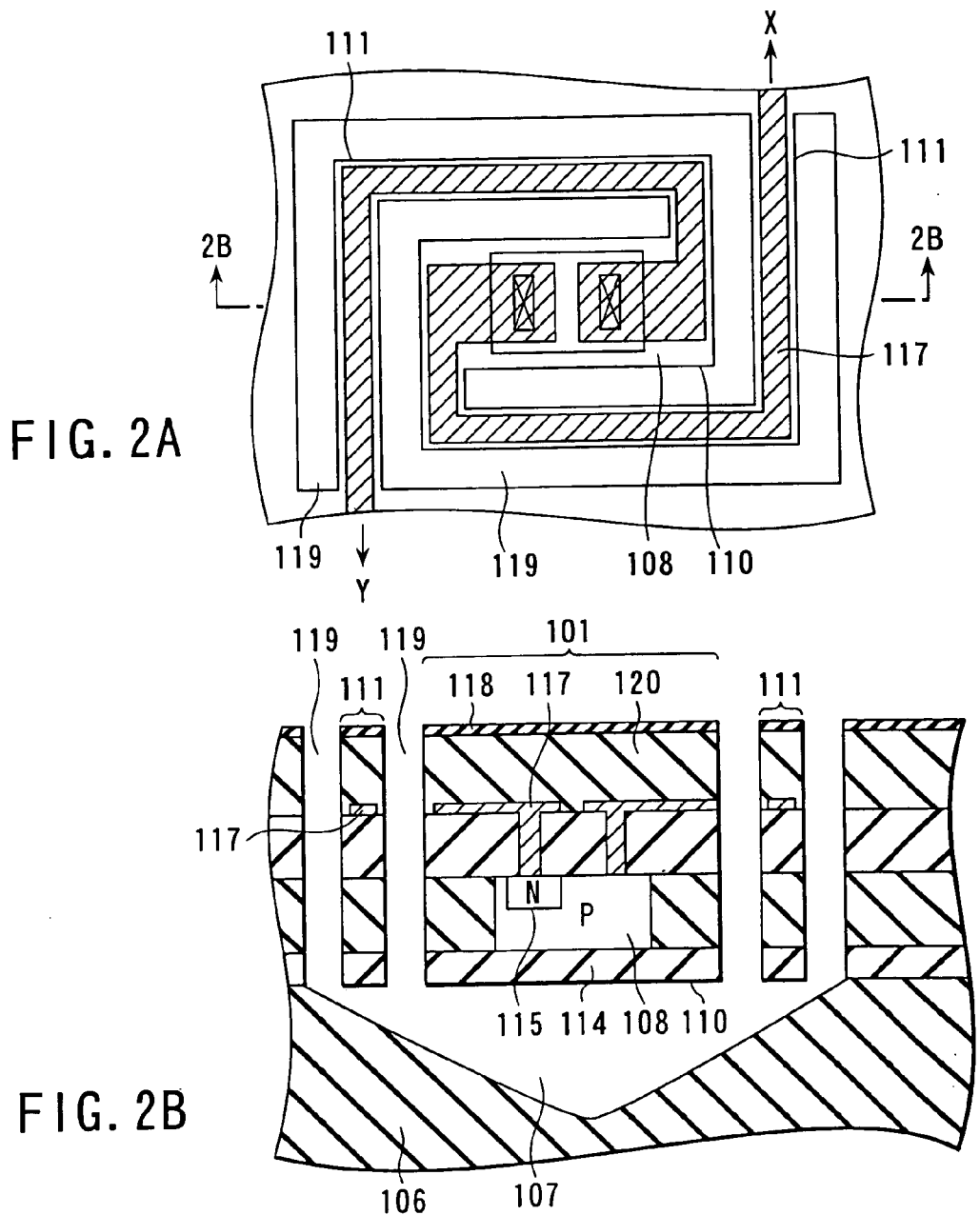
FIG. 2A
FIG. 2B
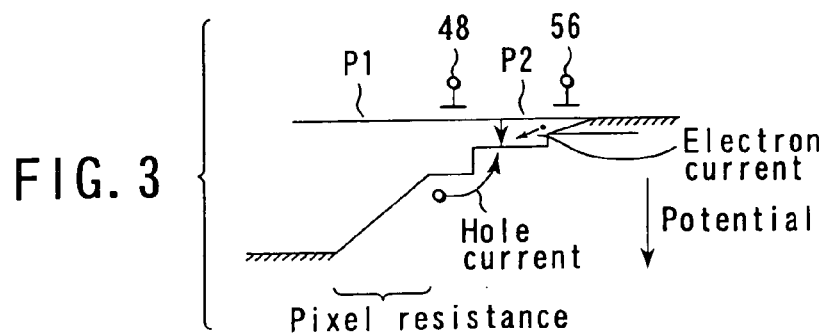
FIG. 3

SOLID-STATE INFRARED IMAGER

CROSS-REFERENCE TO RELATED APPLICATIONS

This application is based upon and claims the benefit of priority from the prior Japanese Patent Application No. 2001-295106 filed Sep. 26, 2001, the entire contents of which are incorporated herein by reference. This application is a divisional application of U.S. patent application Ser. No. 10/244,403, filed on Sep. 17, 2002, that issued as U.S. Pat. No. 6,809,320.

BACKGROUND OF THE INVENTION

1. Field of the Invention

The present invention generally relates to a solid-state infrared imager, and more particularly to an uncooled or thermal solid-state infrared imager having an improved signal-readout structure.

2. Description of the Related Art

An infrared imager is capable of capturing the image of an object without any distinction between night and day, and is advantageous in that the image is captured using infrared radiation whose penetration in smoke or fog is higher than that of visible radiation and in that temperature information of the object is also obtained. Therefore, the imager is widely applicable to defense systems, surveillance cameras, fire detection cameras, and the like.

Conventionally, the solid-state infrared imager of the quantum type has been regarded as the mainstream imager, but has a serious drawback in that a cooling system is required for low-temperature operation. In recent years, development of an uncooled solid-state infrared imager, which does not require a cooling system, has become vigorous. The uncooled solid-state infrared imager obtains infrared image information, read as an electric signal corresponding to incident infrared radiation having a wavelength of about 10 μm, from each thermal or infrared sensing pixel using a structure for absorbing the infrared radiation as heat which causes a slight change in the temperature thereof, and using a thermoelectric converter to convert the temperature of the absorbing structure to an electric signal.

As an example of an infrared sensing pixel of the uncooled solid-state infrared imager, an infrared sensor containing a silicon pn-junction thermoelectric converter element has been reported (Tomohiro Ishikawa, et al., Proc. SPIE Vol. 3698, p. 556, 1999). This thermoelectric converter element is formed in an SOI substrate to convert the temperature change of an infrared absorber to a voltage change using a constant forward-bias current. The silicon pn-junction thermoelectric converter element using the SOI substrate has the advantageous feature that the element can be fully manufactured by a silicon LSI manufacturing process, and is therefore superior in mass producibility. Moreover, the pn-junction thermoelectric converter element has pixel selectivity inherent in rectification characteristics. Therefore, the internal structure of each pixel can be simplified with the use of this converter element.

Additionally, the temperature change of an infrared sensing pixel in the uncooled solid-state infrared imager depends on the absorptance of an infrared absorber or an optical system, but is generally about $5 \times 10^{-3}$ times the temperature change of the object. When the object temperature changes by 1 K, the pixel temperature changes by 5 mK. In a case where eight silicon pn-junction diodes are connected in series to form the pn-junction thermoelectric converter element for each pixel, thermoelectric conversion efficiency is about 10 mV/K. Therefore, when the object temperature changes by 1 K, a signal voltage of 50 μV is generated in each pixel. Actually, a resolution for distinguishing the object temperature difference of about 0.1 K is required in many cases. Therefore, it is necessary to read a signal voltage of about 5 μV generated for the temperature difference.

As a method of reading out this very slight signal voltage, there is a known circuit in which the signal voltage generated in each pixel is used as a gate voltage of a MOS transistor for current-amplification and the amplified signal current is integrated over time by an integration capacitor. This circuit is called a gate modulation integrator circuit (GMI circuit). Such GMI circuits are disposed as column amplifiers in columns of a pixel matrix array to amplify the currents of the pixels in one row in parallel. This structure limits the signal bandwidth. Thus, random noise can be reduced.

The voltage gain G in the gate modulation integrator circuit is principally determined by the mutual conductance gm ($=\delta Id/\delta Vg$) of the amplification transistor, the integration time ti, and the integration capacitance Ci, and is represented as follows:

$$G = (ti \times gm)/Ci \quad (1)$$

When the integration time ti and integration capacitance Ci are given, the above-described gain is determined by the mutual conductance of the amplification transistor gm. When the n-type MOS transistor operates in a saturated region, gm is approximated by the following equation (2):

$$gm = (W/L) \cdot (\epsilon ox/Tox) \cdot \mu n \cdot (Vgs - Vth) \quad (2)$$

where W is the channel width, L is the channel length, $\epsilon ox$ is the permittivity of the gate oxide film, Tox is the gate oxide film thickness, μn is the electron mobility, Vgs is the voltage between gate and source, and Vth is the threshold voltage of the transistor.

As described above, a resolution for distinguishing the object temperature difference of about 0.1 K is required. Therefore, it is necessary to read a signal voltage of about 5 μV when the signal voltage is output from a pixel. This signal voltage level is very low compared with the voltage of a CMOS sensor by which an image is captured with general visible radiation. For example, according to a document ("High-Sensitivity CMOS Image Sensor", the Journal of the Institute of Image Information and Television Engineers Vol. 54, No. 2, p. 216, 2000, the entire contents of which are incorporated by reference), the noise voltage is about 0.4 mV=400 μV. Compared with this, the noise level of the above-described infrared sensor is a low voltage corresponding to about 1/80 of the level of the CMOS sensor, and the signal voltage to be handled is similarly a low voltage of about 1/80.

Therefore, considering that an infrared sensor output is processed by circuitry similar to the CMOS sensor, the column amplifier must be formed of a gate modulation integrator circuit having about 80 times the gain.

The above-described uncooled solid-state infrared imager uses circuitry called a constant current biased voltage readout system to read out a signal from an infrared sensor containing a silicon pn-junction thermoelectric converter element. This solid-state infrared imager has some problems.

As a first problem, a plurality of silicon pn-junction diodes need to be connected in series inside each pixel in order to enhance the thermoelectric conversion sensitivity. Therefore, the pixel structure becomes complicated, and it is difficult to miniaturize the pixels.

A second problem results from the first problem. Since the infrared sensor uses the plurality of silicon pn-junction diodes connected in series within the pixel, a voltage much higher than a usual CMOS device power source voltage of 1 to 3 V is required for an optimum operation of the infrared sensor.

For example, when the number of pn-junction diodes is eight, a high voltage close to 10 V is necessary. Therefore, a design and manufacturing process of peripheral circuits such as a row selection circuit requires additional structure and manufacturing process for increasing a withstand voltage, which are not required in a standard CMOS device.

A third problem exists in the thermoelectric conversion sensitivity. Considering from the operation principle of the uncooled solid-state infrared imager using the silicon pn-junction thermoelectric converter element, the thermoelectric conversion sensitivity of the constant current biased voltage readout system is lower than that of a constant voltage biased current readout system.

Furthermore, another important problem is a self-heating problem. The uncooled solid-state infrared imager generally requires a current flowing in the thermoelectric converter element in order to read out temperature information from the thermoelectric converter element as an electric signal. Joule-heating is generated in the thermoelectric converter element by a bias current or voltage for reading out the temperature information, and the thermoelectric converter element is heated by this Joule-heating. A so-called self-heating problem occurs in this manner.

BRIEF SUMMARY OF THE INVENTION

An object of the present invention is to provide a solid-state infrared imager, infrared sensor, signal reading method, in which characteristics of a broad dynamic range, high sensitivity and low noise level can be attained without requiring an increase in the manufacturing cost.

According to a first aspect of the present invention, there is provided a solid-state infrared imager which comprises: a matrix array of infrared sensing pixels which are formed as an imaging area on a semiconductor substrate and each of which contains a pn-junction thermoelectric converter element to sense incident infrared radiation; a plurality of row selection lines each connected to the infrared sensing pixels of a corresponding row; a plurality of signal lines each connected to the infrared sensing pixels of a corresponding column; a row selection circuit which selects and drives one of the row selection lines; and a signal readout circuit which reads out signal currents output to the signal lines from the infrared sensing pixels corresponding to the row selection line driven by the row selection circuit; the signal readout circuit including a signal line potential stabilizing circuit which stabilizes the potential of the signal line to a constant level, and a current-voltage converter which converts the signal current flowing in the signal line to a signal voltage.

According to a second aspect of the present invention, there is provided an infrared sensor which comprises: a pn-junction thermoelectric converter element formed on a semiconductor substrate; a driving circuit which drives the pn-junction thermoelectric converter element; a signal line connected to the pn-junction thermoelectric converter element; and a signal readout circuit which reads out a signal current output to the signal line from the pn-junction thermoelectric converter element; the signal readout circuit including a signal line potential stabilizing circuit which stabilizes the potential of the signal line to a constant level, and a current-voltage converter which converts the signal current flowing in the signal line to a signal voltage.

According to a third aspect of the present invention, there is provided a signal reading method for a solid-state infrared imager which comprises: a matrix array of infrared sensing pixels which are formed as an imaging area on a semiconductor substrate and each of which contains a pn-junction thermoelectric converter element to sense incident infrared radiation; a plurality of row selection lines each connected to the infrared sensing pixels of a corresponding row; a plurality of signal lines each connected to the infrared sensing pixels of a corresponding column; a row selection circuit which selects and drives one of the row selection lines; and a signal readout circuit which reads out signal currents output to the signal lines from the infrared sensing pixels corresponding to the row selection line driven by the row selection circuit; the signal reading method which comprises stabilizing the potential of the signal line to a constant level, and converting the signal current flowing in the signal line to a signal voltage.

With the solid-state infrared imager, the signal line potential is stabilized by the signal line potential stabilizing circuit. Therefore, a bias voltage drop resulting from signal line potential fluctuation, that is, the negative feedback problem which has been a problem in a conventional current readout system is solved, so as to attain original high-sensitivity characteristics of the current readout system.

Further, the current-voltage converter which converts the signal current to the signal voltage can remarkably reduce a thermal noise in a load resistor, which has been a problem in the conventional current-voltage conversion by the load resistor. A random noise can be suppressed from increasing, so as to attain the original high-sensitivity characteristics of the current readout system.

Moreover, the above-described structure allows subtraction of removing an undesired bias component which is introduced in the signal current by self-heating of the pn-junction thermoelectric converter element. Thus, the signal current containing only a true signal component can be converted to the signal voltage to be amplified. As a result, requirements to the structure of the signal readout circuit can be reduced, and cost reduction can be realized together with the sensitivity enhancement.

With the infrared sensor and the signal reading method, substantially the same effects as those of the solid-state infrared imager can be attained.

BRIEF DESCRIPTION OF THE SEVERAL VIEWS OF THE DRAWING

FIGS. 2A and 2B are views showing the plane and sectional structures of an infrared sensing pixel shown in FIG. 1;

FIG. 3 is a diagram showing a signal line potential stabilized by a MOS transistor in a signal line potential stabilizing circuit shown in FIG. 1;

DETAILED DESCRIPTION OF THE INVENTION

Figure 1:
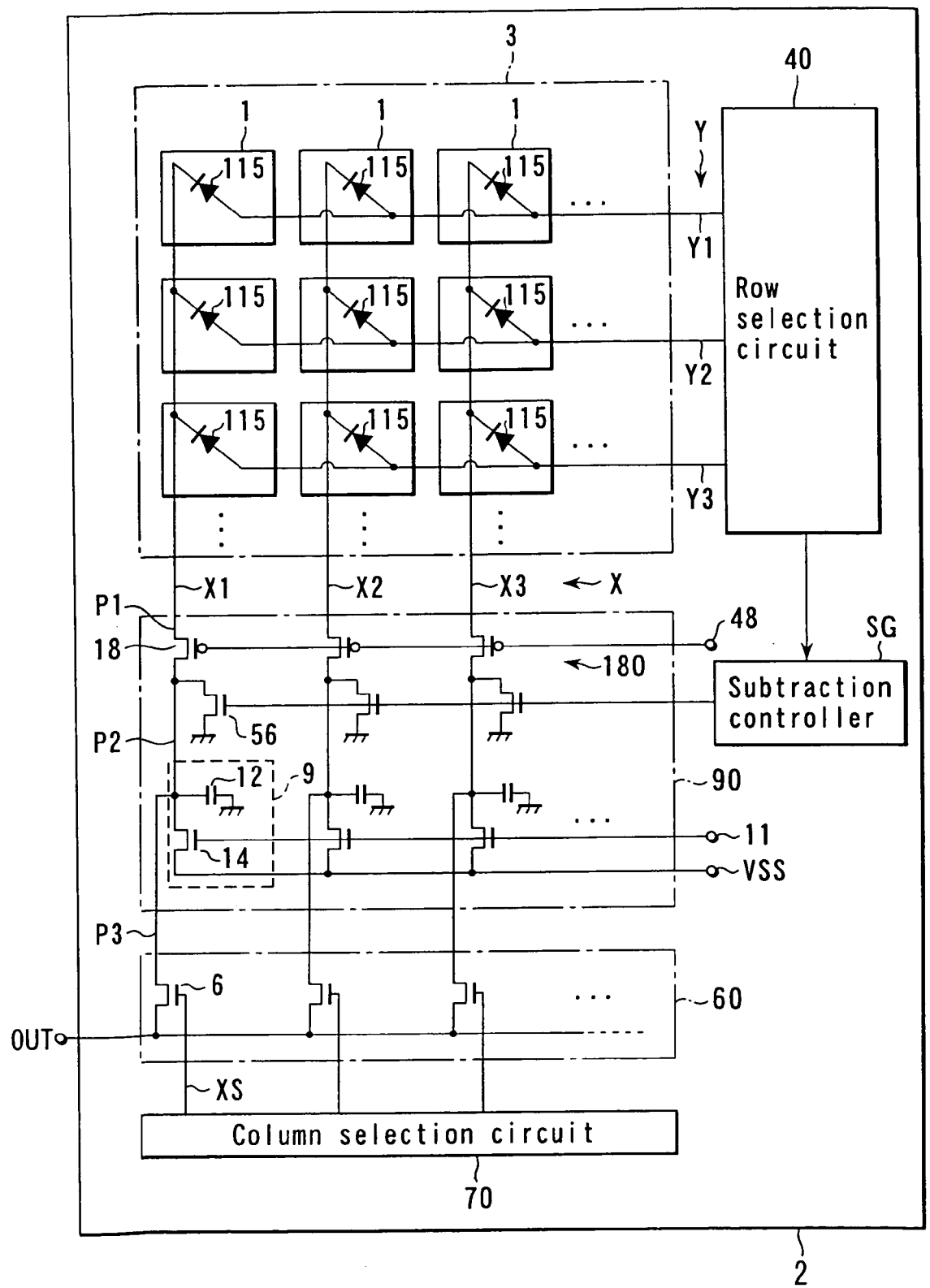
FIG. 1 is a diagram showing the whole configuration of an uncooled solid-state infrared imager according to a first embodiment.

First, the inventors' view of the thermoelectric conversion sensitivity of the current readout system will be described, which is generally used in an uncooled solid-state infrared imager.

Presuming operation in a diffusion current region in which thermal sensitivity is high, a forward-bias current If of a forward-biased silicon pn-junction is approximated by the following equation (3):

$$If = Io \cdot \exp(q(Vf - Eg)/kT) \quad (3)$$

where Io is the reverse-bias saturation current, q is the charge amount of electron, Vf is the forward-bias voltage, Eg is the band gap, k is the Boltzmann constant, T is the absolute temperature. When the equation (3) is differentiated with the temperature T, If or Vf is set to be constant, and thereby the thermoelectric conversion sensitivity of the voltage or current readout system can be obtained.

That is, in the voltage readout system, the temperature coefficient of voltage (TCV) and temperature coefficient of current (TCC) are represented by the following equations (4) and (5):

$$TCV = (\Delta V / \Delta T) / V = [(V - Eg)/T]/V \quad (4)$$
$$TCC = (\Delta I / \Delta T) / I$$

$$= -[(V - Eg)/T]/(kT/q) \quad (5)$$

Considering that operation is effected in the diffusion current region, and comparing these thermoelectric conversion sensitivities with each other, the following equation (6) is obtained.

$$|TCC|/TCV| = V/(kT/q) > 1 \quad (6)$$

That is, when the bias conditions are substantially identical, the current readout system has a higher sensitivity as compared with the voltage readout system.

However, when the current readout system is employed for high sensitivity, several problems are newly raised. Since the readout current is remarkably slight, the current needs to be converted to the voltage and amplified. However, when a load resistor is used as a simple circuitry for current voltage conversion, a thermal noise is generated in the load resistor. Since an influence of increase of noise is larger than that of enhancement of sensitivity, the noise equivalent temperature difference (NETD) cannot be improved.

Moreover, there is a countermeasure that uses an integration capacitor as a circuit for current voltage conversion to avoid the thermal noise in the load resistor. In this countermeasure, however, a negative feedback occurs similarly as the circuit using the above-described load resistor. That is, the signal line potential varies with charge accumulated by current integration, and causes a drop in the forward-bias voltage of the pn-junction. Therefore, sufficient sensitivity enhancement effect cannot be attained.

Such a negative feedback can be reduced by a circuitry using a bipolar transistor, for example. However, the manufacture of this circuitry requires a so-called Bi-CMOS process, which is complicated more than a CMOS process. Therefore, an increase in the manufacturing cost cannot be avoided.

Secondly, inventors' view of the self-heating problem in the uncooled solid-state infrared imager will be described. In a case where a pn-junction thermoelectric converter element is formed on a semiconductor substrate as the infrared sensing pixel, the thermal conductance between the thermoelectric converter element and the semiconductor substrate is generally at a value of $10^{-7}$ W/K. Due to the self-heating effects, the temperature of the pn-junction thermoelectric converter element rises about 30 K. This value is obtained by calculation, assuming that the number of pn-junction diodes is eight, bias current is 200 µA, a pixel selection period for reading out the signal is 25 µs, and a frame rate is 60 fps. This temperature rise is very large as compared with a temperature rise of 5 mK caused by the above-described incident infrared radiation. Therefore, it is very important to solve the self-heating problem.

Figure 18:
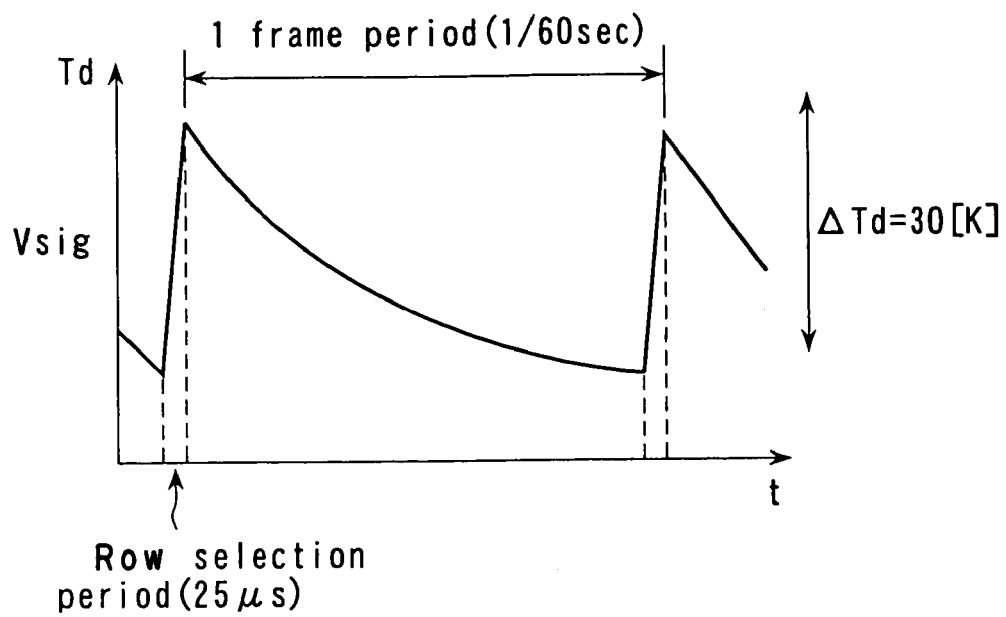
FIG. 18 is a graph showing an example of the temperature of an infrared sensing pixel changed by self-heating in a frame period.

FIG. 18 shows one example of the pixel temperature changed by self-heating as a result of conversion to an output signal voltage Vsig. As apparent from FIG. 18, a pixel temperature Td rapidly rises due to Joule-heating generated upon application of a row selection pulse voltage for a row selection period, and is moderately lowered according to a heat time constant of the thermoelectric converter element after the row selection pulse is turned off. That is, the pixel temperature Td rapidly changes together with the output signal voltage Vsig, and returns to original temperature in one frame period.

As described above, the temperature rise by self-heating is about 30 K obtained by the calculation, but the temperature change by the incident infrared radiation is only about 5 mK, which is a remarkably small and slight signal as compared with the curve in FIG. 18.

Accordingly, in the general column amplifier connected to the signal line, a slight current flows in an initial stage of the pixel selection period, and the amount of the current increases with an elapse of time by self-heating during the pixel selection. In this operation, the major part of the current is a noise component representing temperature information caused by self-heating.

Figure 19:
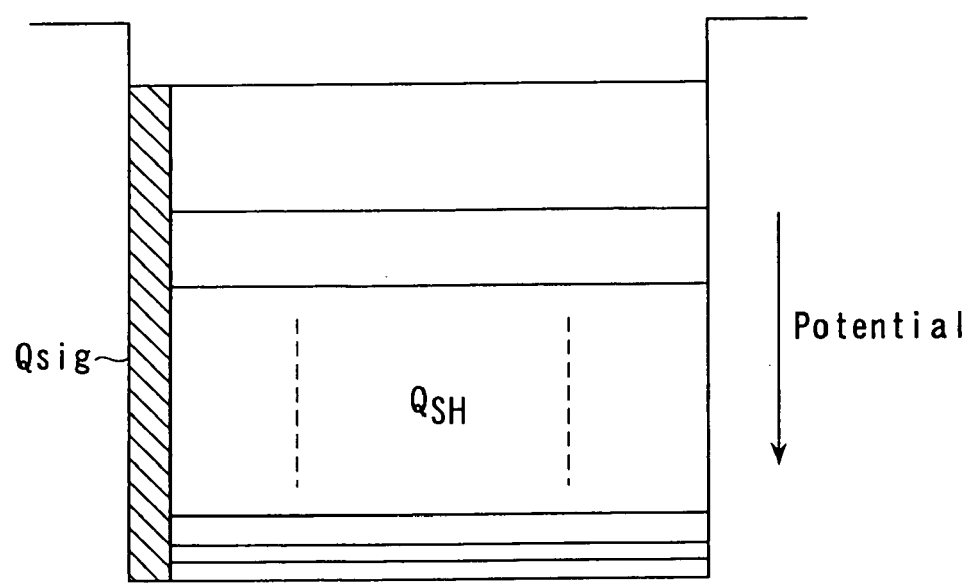
FIG. 19 is a diagram schematically showing a model in which a signal charge $Q_{sig}$ and self-heating noise charge $Q_{SH}$ held in the integration capacitor of a column amplifier are accumulated in a pixel selection period.

FIG. 19 schematically shows a potential well model of charge integrated or accumulated in the integration capacitor disposed on an output side of the column amplifier. As apparent from FIG. 19, the major part of the accumulated charge is a self-heating noise charge $Q_{SH}$, and a signal charge $Q_{sig}$ serving as the remainder is extremely slight.

In addition, it can be seen in FIG. 19, that a large current flows in a latter half of the row selection period due to the temperature rise of the self-heating effects and that information in the latter half to a final stage of the row selection period is weighted as a result. Since the information is weighted, the effective sampling time is reduced to enlarge the signal bandwidth. This allows an increase in the random noise, which degrades the temperature resolution of the solid-state infrared imager.

The above-described self-heating effects can be suppressed by a method of amplifying a differential output from a bridge circuit which includes a bolometer, thermister, or the like using a special component such as vanadium oxide whose resistance varies with temperature, and refers to a reference non-sensing pixel which is disposed for each column and has the same thermal capacity and a low thermal resistance. This method uses the fact that the temperature rise by self-heating is principally determined by the thermal capacity in a pixel selection period which is a very short time with respect to the heat time constant.

This method is a rough countermeasure that cannot completely solve the self-heating problem. To completely solve the self-heating problem, it is necessary that reference non-sensing pixels are assigned to the infrared sensing pixels one by one. Therefore, it is not preferable that the countermeasure is practically applied to an imager having a two-dimensional array of pixels because of the following reason. That is, the disposition of the reference non-sensing pixel for the bridge circuit along with the inferred sensing pixel raises a demerit that the sensitivity is lowered to ½ or less with the same pixel size. The use of the bridge circuit capable of canceling the self-heating effect is not acceptable in consideration of the demerit.

Based on the view described-above, the inventors have developed an uncooled solid-state infrared imager in which the silicon pn-junction thermoelectric elements are contained in the infrared sensing pixels, as a countermeasure to the self-heating problem in the voltage readout system (Jpn. Pat. Appln. No. 2001-91173, the entire contents of which are incorporated herein by reference).

Figure 15:
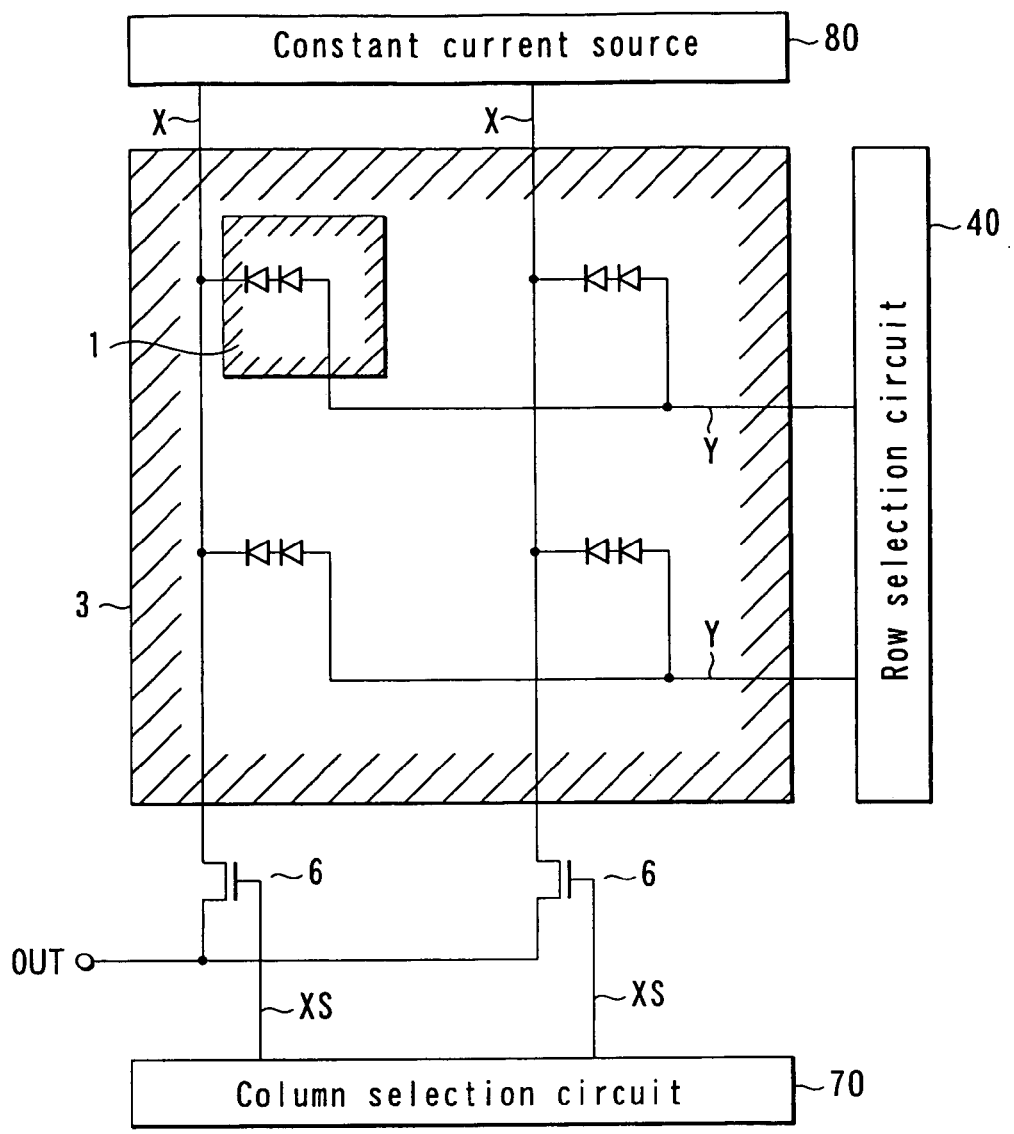
FIG. 15 is a diagram schematically showing the configuration of an uncooled solid-state infrared imager of a voltage readout system in which pn-junctions are used for thermoelectric conversion.

FIG. 15 schematically shows the configuration of the solid-state infrared imager. A row selection circuit 40 performs a row selecting operation by applying a row selection pulse to one of row selection lines so as to reverse-bias the infrared sensing pixels 1 of the selected row. Each constant current from a constant current source 80 flows through a current path formed of a signal line X, a pixel 1, a row selection line Y, and the row selection circuit 40, and temperature information of the pn-junction in the pixel 1 is obtained from the signal line X as voltage information corresponding thereto. The voltage information of each column is output via one of column selection transistors 6 selected by a column selection pulse from a column selection circuit 70.

Figure 16:
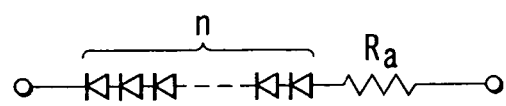
FIG. 16 is a diagram showing an equivalent circuit for an infrared sensing pixel shown in FIG. 15.

FIG. 16 shows an equivalent circuit for the infrared sensing pixel 1 shown in FIG. 15. The pixel 1 contains pn-junction diodes which are connected in series for a purpose of enhancing the sensitivity. In FIG. 16, the pixel 1 also contains an additional resistance component Ra of the pn-junction diodes. This additional resistance component is formed of a wire resistance, contact resistance and the like within a supporting section of thermally isolating a thermoelectric converting section from a semiconductor substrate in the infrared sensing pixel.

Figure 17:
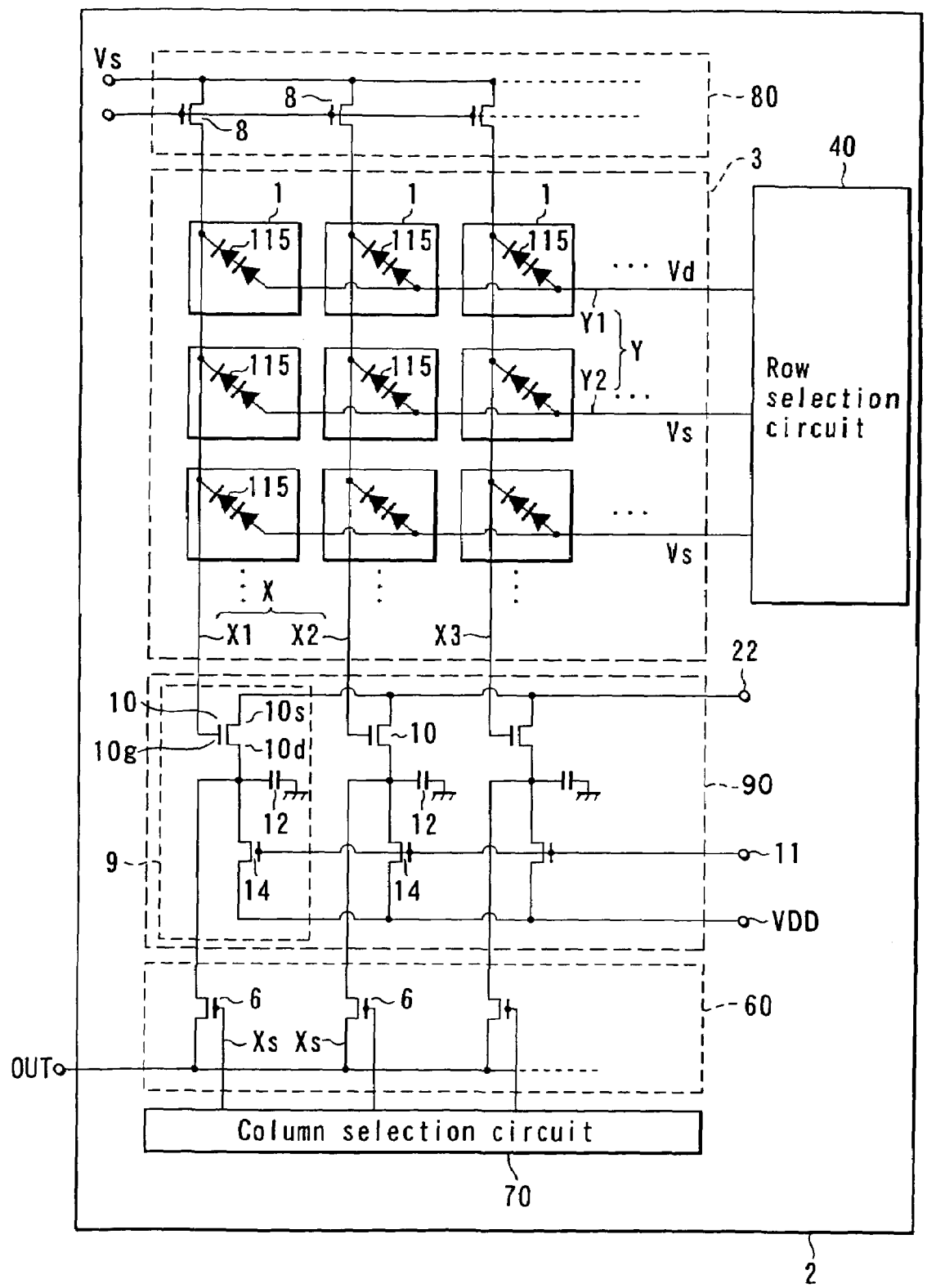
FIG. 17 is a diagram schematically showing the whole configuration of an uncooled solid-state infrared imager containing a column amplification circuit.

FIG. 17 schematically shows the whole configuration of an uncooled solid-state infrared imager containing a column amplification circuit. In the configuration according to FIG. 15, the output of a signal line is supplied directly to the outside. On the other hand, in the configuration according to FIG. 17, the above-described gate modulation integrator circuit (GMI circuit) is disposed for each column as a column amplifier so as to cope with the fact that the output of a signal line is considerably slight.

The configuration and operation of the uncooled solid-state infrared imager shown in FIG. 17 will be described briefly. In FIG. 17, infrared sensing pixels 1 are arrayed in a two-dimensional matrix of m rows and n columns (m, n are natural numerals of 2 or more).

The two-dimensional matrix array of the infrared sensing pixels 1 are formed on a semiconductor substrate 2 as an imaging area 3, in which incident infrared radiation is converted into an electric signal. In the imaging area 3, row selection lines Y (Y1, Y2 . . . ) and signal lines X (X1, X2 . . . ) are disposed. The row selection lines Y extend in the horizontal or row direction, and the signal lines X extend in the vertical or column direction. For selection of each pixel 1, a row selection circuit 40 and a column selection circuit 70 are disposed adjacent to the imaging area 3 in the row and column directions, respectively. The row selection circuit 40 is connected to the row selection lines Y, and the column selection circuit 70 is connected to column selection lines XS.

As a constant current source 80 for obtaining pixel output voltages, load MOS transistors 8 are connected to the signal lines X. In FIG. 17, a substrate voltage Vs is applied to the source of the load MOS transistor. However, it is preferable that the voltage applied to the source is adjusted to comply with various requirements.

A power source voltage Vd is applied to one of the row selection lines Y, for example, Y1 selected by the row selection circuit 40, and the substrate voltage Vs is applied to the row selection lines Y not selected by the row selection circuit 40. As a result, a series of pn-junction diodes 115 are forward-biased in each of the infrared sensing pixels 11 corresponding to the row selection line Y1, and a forward-bias current flows therethrough. The operation point of each pixel is determined by the temperature and the forward-bias current thereof, and signal voltages are obtained from the signal lines X1, X2, . . . . At this time, the series of pn-junction diodes 115, . . . in each of the infrared sensing pixels corresponding to the row selection lines Y2 to Ym not selected by the row selection circuit 40 is reverse-biased. That is, the pn-junction in each pixel has pixel selectivity.

The voltage obtained from each signal line X is considerably low. Assume that a ratio of a pixel temperature change $\Delta Td$ to a temperature change $\Delta Ts$ of an object is $5 \times 10^{-3}$. When the ratio is referred to along with the thermoelectric conversion sensitivity $\Delta V/\Delta Td = 10$ mV/K for eight pn-junction diodes connected in series, the voltage of 5 μV is obtained when the temperature change ΔTs=0.1 K.

Therefore, to recognize an object temperature difference, it is necessary that noise in the signal line X is suppressed to 5 μV or less. This noise level is about 1/80 of that of a CMOS device serving as a MOS-type visible image sensor and is very low.

A column amplification circuit 90 is connected between the signal lines X1, X2, ... and a column selection transistor circuit 60. The column amplification circuit 90 includes n column amplifiers 9 each formed of a GMI circuit.

Each column amplifier 9 includes a MOS transistor 10 for amplification. The MOS transistor 10 has its gate 10g connected to the signal line X, its source 10s connected to a source voltage terminal 22, and has its drain 10d connected to an integration capacitor 12 for integrating or accumulating the amplified signal current. The integration time for integrating the signal current is determined by the row selection pulse applied to the row selection line Y by the row selection circuit 40.

Moreover, the integration capacitor 12 is connected to a reset transistor 14 for resetting the voltage of the integration capacitor 12 after completion of a readout operation during which the voltage is read out as a signal to an output terminal OUT via the column selection transistor 6.

With the above-described configuration, an infrared image can be captured. However, as described above, it is difficult to miniaturize the pixel due to the complicate pixel structure. Further, a power source voltage higher than that of a CMOS device is generally required for an optimum operation. Moreover, the thermoelectric conversion sensitivity is considerably low.

An uncooled solid-state infrared imager according to a first embodiment of the present invention will be described below. FIG. 1 shows the whole configuration of the uncooled infrared sensor. As shown in FIG. 1, in the uncooled solid-state infrared imager, a signal line potential stabilizing circuit 180 for stabilizing the potential of each signal line X into a constant level is provided instead of the constant current source 80. Components similar to those shown in FIG. 17 are represented by same reference numerals in FIG. 1, and the descriptions thereof are simplified or omitted. In the subsequent embodiments, the similar components are represented by the same numerals and the descriptions thereof are simplified or omitted as well.

The uncooled solid-state infrared imager shown in FIG. 1 operates in substantially the same manner as those in FIGS. 15 and 17, except that the potential stabilizing circuit 180 provides a constant voltage biased current readout system in which the temperature information of each inferred sensing pixel 1 is obtained as a signal current from the signal line X.

Therefore, the column amplification circuit 90 in FIG. 1 requires amplifiers of a current input type, not of a voltage input type like the GMI circuit in FIG. 17. If a structure of the GMI circuit is used, a current-voltage converting section is disposed at a preceding stage of the GMI circuit structure.

FIG. 2A shows the plane structure of the infrared sensing pixel 1 shown in FIG. 1, and FIG. 2B shows the sectional structure of the infrared sensing pixel 1 along the line 2B—2B shown in FIG. 2A.

The infrared sensing pixel 1 includes a thermoelectric converting section 101 which contains infrared absorbing layers 118 and 120 formed as a infrared absorber above a hollow portion 107 of a single crystal. silicon substrate 106, a single pn-junction diode 115 formed of a p-type semiconductor region of an SOI layer 108 and the n-type semiconductor region formed in the p-type semiconductor region, wiring lines 117 connected to the p- and n-type semiconductor regions, and an embedded silicon oxide film 114 formed on the bottom surface of the SOI layer 108.

Moreover, the infrared sensing pixel 1 further includes a supporting section 111 for supporting the thermoelectric converting section 101 without any contact with a bottom surface and side surface 119 of the hollow portion 107. The wiring lines 117 are formed to extend from the thermoelectric converting section 101 to the supporting section 111 as leads for the electric signal from the pixel 1, and connected to the signal line X and row selection line Y via contacts (not shown).

The thermoelectric converting section 101 and the supporting section 111 are disposed above the hollow portion 107, heat dissipation from the thermoelectric converting section 101 (pixels 1) becomes sluggish, and thus the temperature of the thermoelectric converting section 101 is efficiently modulated by the incident infrared radiation. Additionally, a concrete manufacturing method for the structure is described in detail in related patents made by the present inventors, such as U.S. Pat. Nos. 6,541,298 and 6,573,504.

The signal line potential stabilizing circuit 180 is disposed in the column amplification circuit 90, and includes n p-channel MOS transistors 18 each serving as a constant voltage source (or signal line potential stabilizer) for stabilizing the potential of a corresponding signal line X. Each MOS transistor 18 has a source connected to a node P1 on the side of the corresponding signal line X, a drain connected to a node P2 on the side of the integration capacitor 12, and a gate connected to a voltage terminal 48, and the channel potential thereof is controllable by applying a desired voltage to the voltage terminal 48. A signal charge from the source of the MOS transistor 18 is supplied to the integration capacitor 12, and the integration capacitor 12 integrates the signal charge to output the signal charge as a voltage from a node P3.

The drain potential of the potential stabilizing MOS transistor 18 is reset by applying an appropriate voltage to the gate voltage terminal 11 with respect to the drain of the MOS transistor 14.

Figure 4:
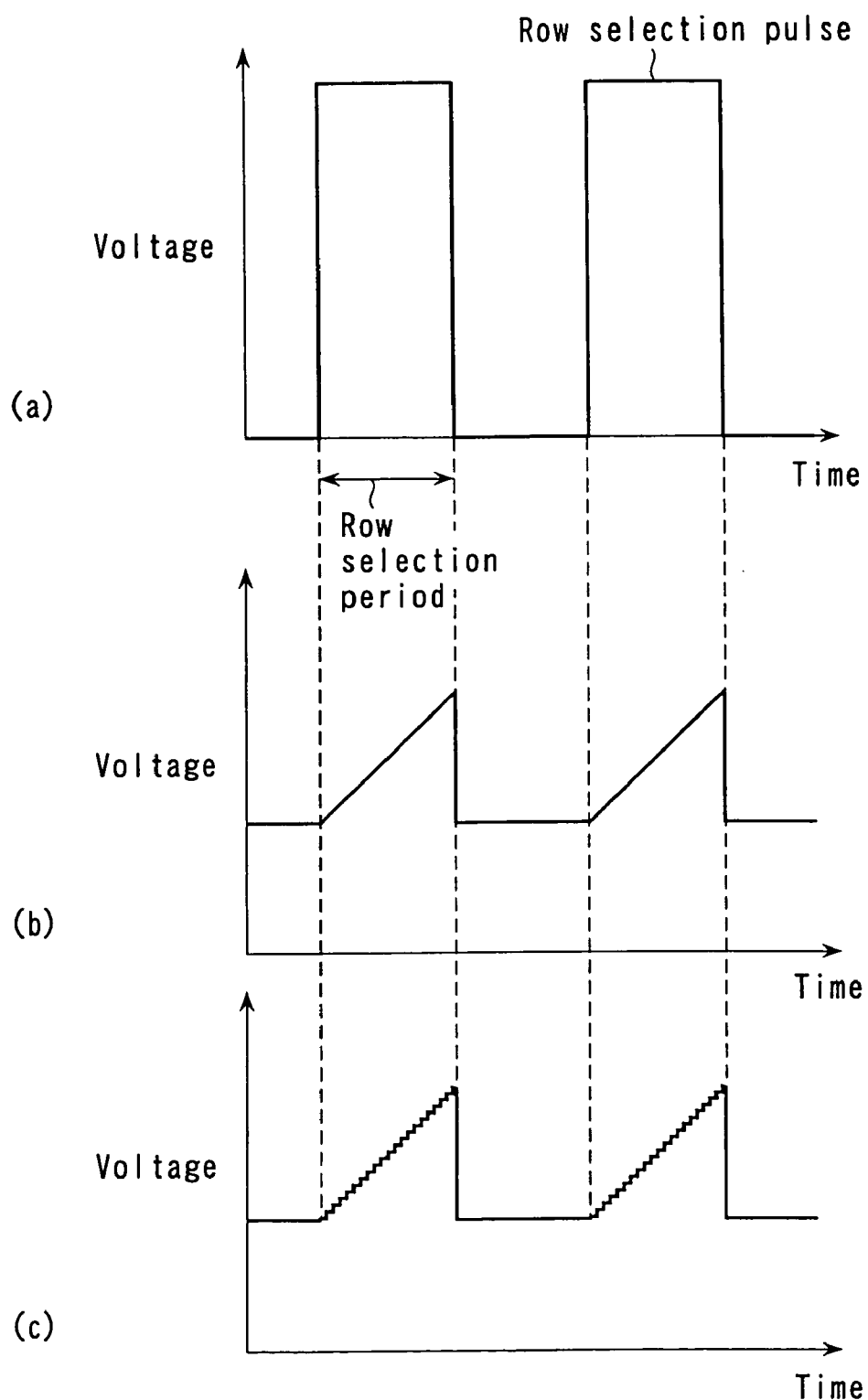
FIG. 4 is a diagram showing waveforms for explaining the operation of a subtraction controller shown in FIG. 1.

Further, the column amplification circuit includes an n-channel MOS transistors 56. Each MOS transistor 56 is connected between the node P2 on the output side of the MOS transistor 18 and the ground terminal, and subtracts the current from the MOS transistor 18 according to the gate potential. The gate of each MOS transistor is connected to a subtraction controller SG. The row selection pulse from the row selection circuit 40 is shown in (a) of FIG. 4. The subtraction controller SG responds to the row selection pulse, and produces a ramp waveform voltage shown in (b) of FIG. 4, or a step waveform voltage shown in (c) of FIG. 4. In addition, the subtraction controller SG can be disposed outside the semiconductor substrate 2.

Moreover, the column amplification circuit 90, the column selection transistor circuit 60, and the column selection circuit 70 are used as a signal readout circuit.

According to the first embodiment, a current readout system, which is highly sensitive in principle, is employed for reading a current signal that changes in accordance with to an electric signal produced from the thermoelectric converting section 101 upon incidence of the infrared radiation, instead of a voltage signal. The signal line potential stabilizing circuit 180 is added to stabilize the potentials of the signal lines X. Thus, the negative feedback problem of the bias voltage drop resulting from the signal line potential fluctuation is solved, and the original high-sensitivity characteristics of the current readout system can be obtained.

Further, a series of pn-junction diodes are not required in the high-sensitivity current readout system. Since the thermoelectric converter element is formed of a single pn-junction diode, the pixel structure can be simplified. As another advantage, a high forward-bias voltage is not required for the single pn-junction diode of the thermoelectric converter element.

In addition, as shown in FIG. 3, the channel potential of the potential stabilizing MOS transistor 18 is controllable by applying a desired gate voltage to the terminal 48. Thus, the potential of the signal line X can be stabilized to prevent the sensitivity from being reduced by the negative feedback. At this time, it is necessary to adjust the reset condition such that the reset potential of the integration capacitor 12 is lower than the channel potential of the MOS transistor 18.

The subtraction MOS transistor 56 and the subtraction controller SG serve as a current removal circuit for removing a bias current component which is the major part of the signal current from the signal line X and irrespective of the temperature information resulting from infrared radiation incidence to the infrared sensing pixel 1. Since the bias current component is removed, the column amplification circuit 90 outputs a signal representing only the information of the infrared sensing pixel 1 resulting from infrared radiation incidence. The self-heating problem is solved in the manner described above. Thus, the noise component is remarkably reduced. Further, it is possible to set a sufficiently large gain of the amplification circuit. Furthermore, the increase problem of random noise caused by enlargement of the effective signal bandwidth is also solved. Accordingly, an uncooled solid-state infrared imager of remarkably high sensitivity can be obtained in association with the high sensitivity characteristics of the current readout system.

Figure 5:
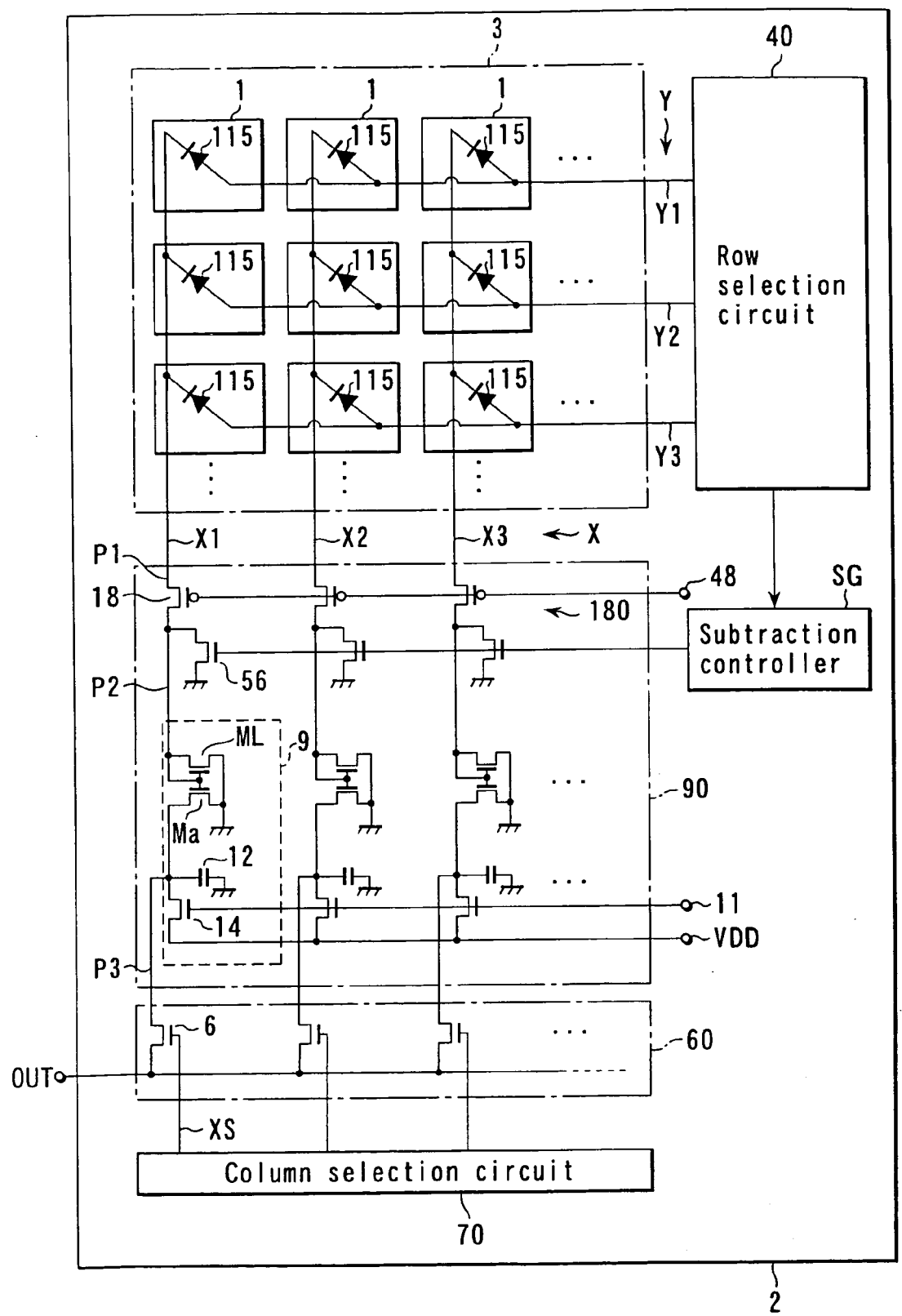
FIG. 5 is a diagram showing the whole configuration of an uncooled solid-state infrared imager according to a second embodiment of the present invention.

An uncooled solid-state infrared imager according to a second embodiment of the present invention will be described. FIG. 5 shows the whole configuration of the uncooled solid-state infrared imager. The uncooled solid-state infrared imager is similar to that of the first embodiment except that each column amplifier 9 is a combination of a current-voltage converter and a GMI circuit as shown in FIG. 5. The current-voltage converter includes an n-channel MOS transistor ML, and the GMI circuit includes an n-channel MOS transistor Ma, an integration capacitor 12, and an n-channel MOS transistor 14. The drain and source of the MOS transistor ML are connected to the node P2 and the ground terminal, respectively. The drain and source of the MOS transistor Ma are connected to the node P3 and the ground terminal, respectively. The gates of the MOS transistors ML and Ma are connected to the node P2. The integration capacitor is connected between the node P3 and the ground terminal. The source and drain of the n-channel MOS transistor 14 are connected to the node P3 and the power source terminal VDD, and the gate of the MOS transistor 14 is connected to the gate voltage terminal 11. The MOS transistor 14 performs a reset operation after completion of a readout operation during which the signal voltage is read out to an output terminal OUT via the column selection transistor 6.

According to the second embodiment, the same effect as that described in the first embodiment can be obtained. That is, the subtraction MOS transistor 56 and the subtraction controller SG serves as a current removal circuit for removing a bias current component which is the major part of the signal current from the signal line X and irrespective of the temperature information resulting from infrared radiation incidence to the infrared sensing pixel 1. Since the bias current component is removed, the column amplification circuit 90 outputs a signal representing only the information of the infrared sensing pixel 1 resulting from infrared radiation incidence. The self-heating problem is solved in the manner described above.

Figure 6:
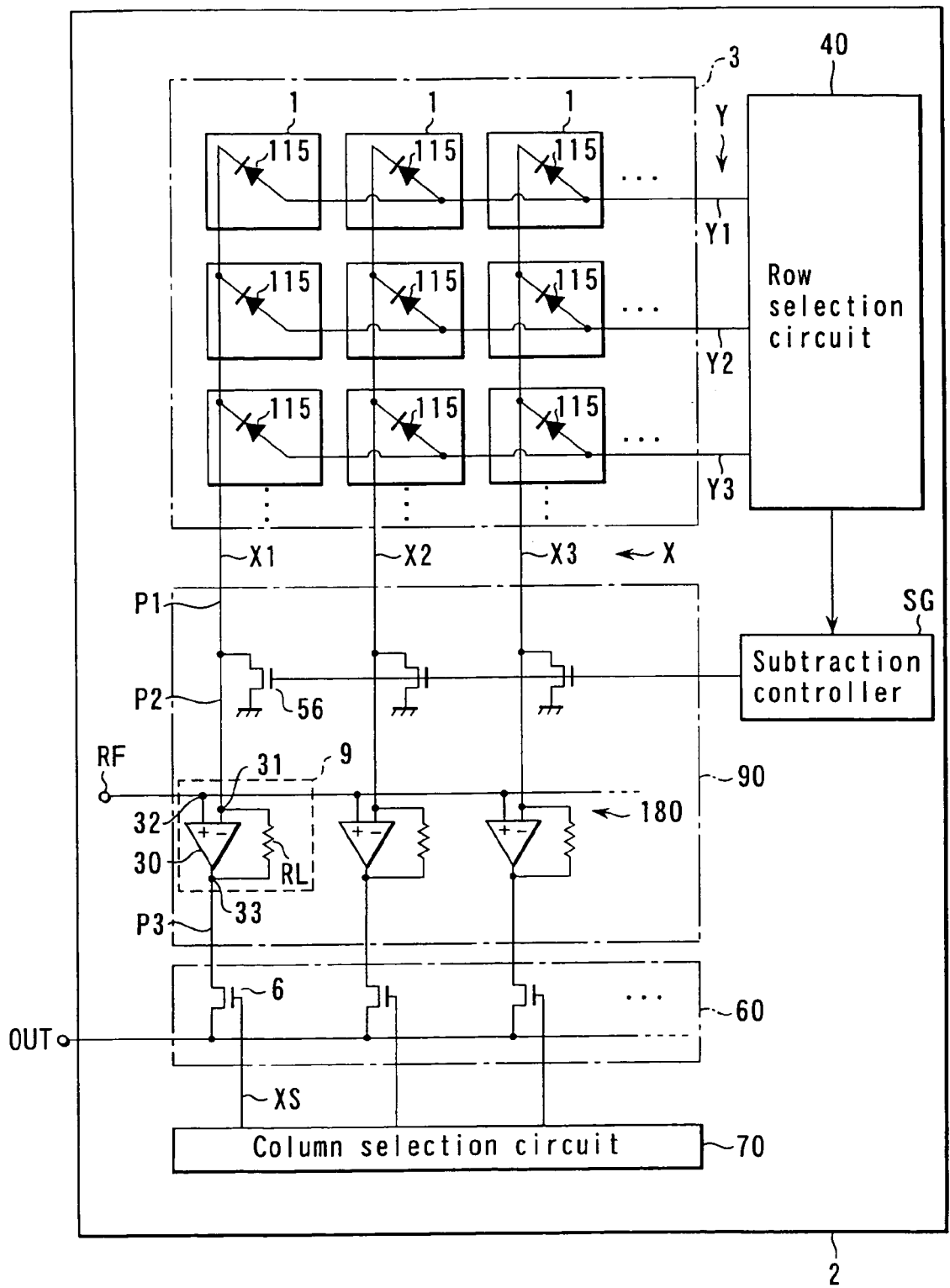
FIG. 6 is a diagram showing the whole configuration of an uncooled solid-state infrared imager according to a third embodiment of the present invention.
Figure 7:
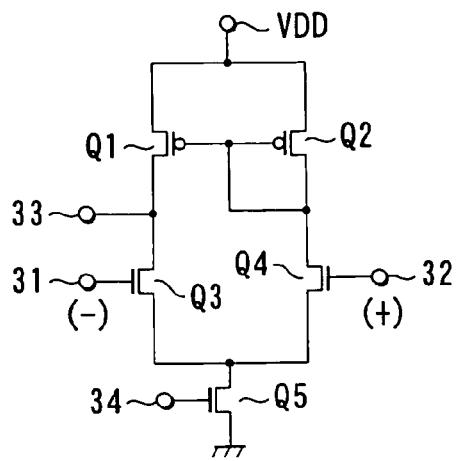
FIG. 7 is a diagram showing one example of the configuration of an operational amplifier shown in FIG. 6.

An uncooled solid-state infrared imager according to a third embodiment of the present invention will be described. FIG. 6 shows the whole configuration of the uncooled solid-state infrared imager. The uncooled solid-state infrared imager is similar to that of the first embodiment except that each column amplifier 9 is formed using an operational amplifier 30, and each p-channel MOS transistor 18 is eliminated.

The operational amplifier 30 has a (−) input terminal 31 connected to the node P2, a (+) input terminal 32 connected to the a voltage terminal RF, and an output terminal 33 connected to the (−) input terminal 31 via a load resistor RL. A signal current from the node P2 is input into the (−) input terminal, and converted to a voltage by a load resistor RL. Further, the voltage is amplified by the operational amplifier 30, and output from the output terminal 33 to the node P3. The operational amplifier 30 includes two p-channel MOS transistors Q1 and Q2, and three n-channel MOS transistors Q3, Q4, and Q5. This is an example of the simplest structure of the operational amplifier 30. The power source voltage VD is applied to the power source terminal VDD, and a current control DC bias voltage is applied to a voltage terminal 34.

According to the third embodiment, the potential of the node P2 becomes the same as that input from the voltage terminal RF to the (+) input terminal 32. Therefore, the operational amplifiers 30 serve as the signal line potential stabilizing circuit 180. Therefore, it is possible to completely prevent the negative feedback to the signal line potential caused when a load resistor is used as a simple circuitry for current voltage conversion. Furthermore, since the operational amplifier 30 performs voltage amplification, it is unnecessary to increase a resistance of the load resistor RL, and it is possible to remarkably reduce thermal noise as random noise generated in the load resistor.

Figure 8:
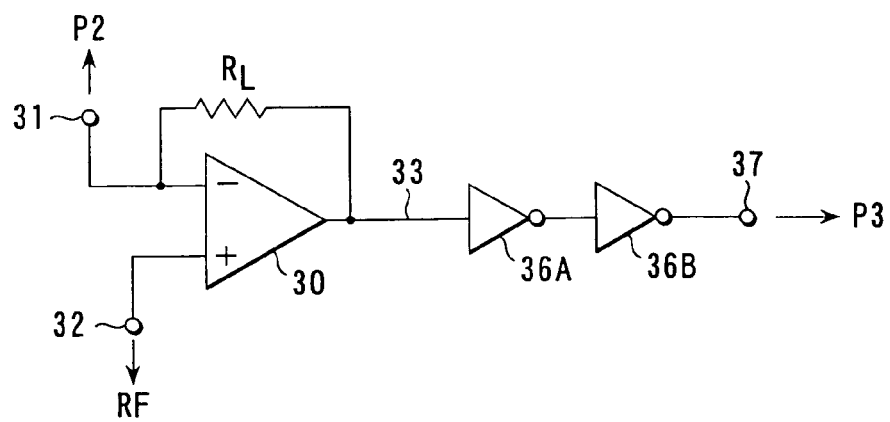
FIG. 8 is a diagram showing a first modification of a column amplifier shown in FIG. 6.
Figure 9:
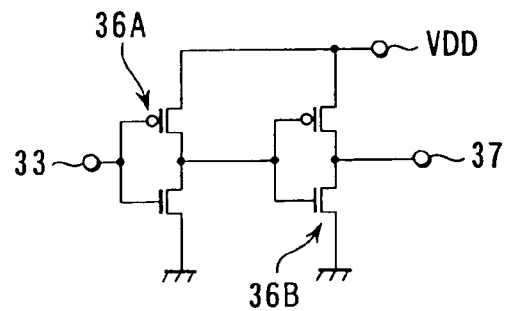
FIG. 9 is a diagram showing the configuration of inverter circuits shown in FIG. 8.

FIG. 8 shows a first modification of the column amplifier 9 shown in FIG. 6. In this modification, the column amplifier 9 includes two inverter circuits 36A and 36B which are connected in series at a stage behind the operational amplifier 30, and each of which has a CMOS structure of p- and n-channel MOS transistors as shown in FIG. 9. The power source voltage Vd is applied to the power source terminal VDD. An input voltage is amplified and output from an output terminal 37.

According to the first modification, it is permissible that an amplification factor determined by the operational amplifier 30 and load resistor RL is lowered. Thus, a thermal noise reduction effect can be obtained by further decreasing the resistance of the load resistor RL. Moreover, a voltage of low impedance is output from the output terminal 37, and therefore the voltage output can be stabilized during the column selection.

In addition, a structure in which one of the inverter circuits 36A and 36B is provided and connected between the output terminal 33 of the operational amplifier 30 and the node P3 is also available. Further, more than two inverter circuits may be connected in series between the output terminal 33 of the operational amplifier 30 and the node P3 so as to enhance a voltage amplification factor.

Figure 10:
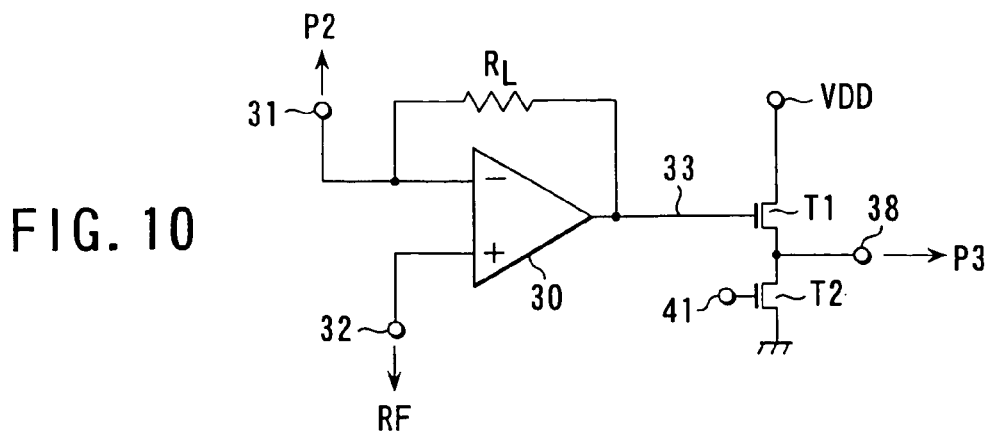
FIG. 10 is a diagram showing a second modification of the column amplifier shown in FIG. 6.

FIG. 10 shows a second modification of the column amplifier 9 shown in FIG. 6. In this modification, the column amplifier 9 includes a floating amplifier provided at a stage behind the operational amplifier 30 as shown in FIG. 10. The floating amplifier is a source follower circuit including n-channel MOS transistors T1 and T2 connected between the ground terminal and the power source terminal VDD to which the power source voltage Vd is applied. The gate of the MOS transistor T1 is connected to the output terminal 33 of the operational amplifier 30, and the gate of the MOS transistor T2 is connected to a gate input terminal set at a predetermined potential. The junction of the MOS transistors T1 and T2 serves as an output terminal 38 connected to the node P3.

According to the second modification, a voltage of low impedance is output from the output terminal 38, and therefore the voltage output can be stabilized during the column selection, as well as the first modification.

Figure 11:
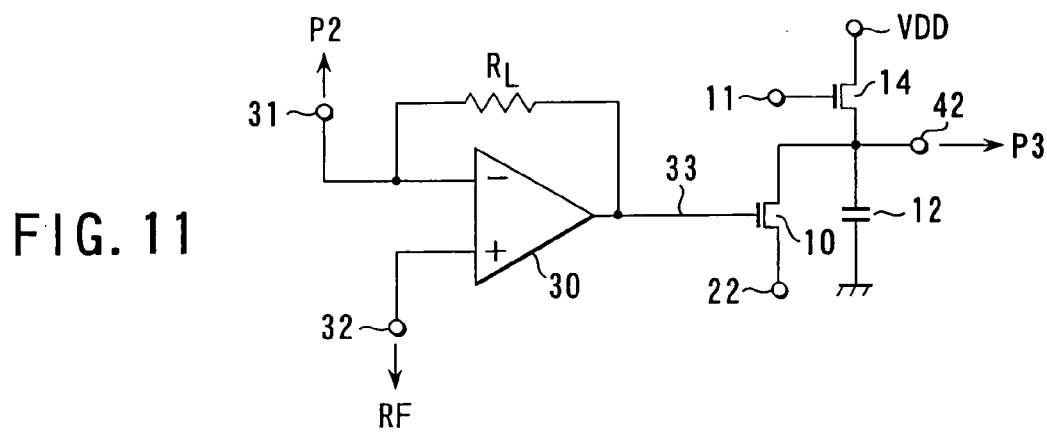
FIG. 11 is a diagram showing a third modification of the column amplifier shown in FIG. 6.

FIG. 11 shows a third modification of the column amplifier 9 shown in FIG. 6. In this modification, the column amplifier 9 includes a GMI circuit provided at a stage behind the operational amplifier 30. The GMI circuit includes the n-channel MOS transistors 10 and 14, and the integration capacitor 12. The gate of the MOS transistor 10 is connected to the output terminal 33 of the operational amplifier 30. The source and drain of the MOS transistor 10 are connected to a voltage terminal 22 and output terminal 42, respectively. The gate of the MOS transistor 14 is connected to the voltage terminal to which the reset voltage is applied. The source and drain of the MOS transistor 14 are connected to an output terminal 42 and the power source terminal VDD, respectively. The output terminal 42 is connected to the node P3. The integration capacitor 12 is connected between to the output terminal 42 and the ground terminal, and integrates or accumulates a current-amplified signal current. An integration time for integrating the signal current is determined by the row selection pulse applied to the row selection line Y by the row selection circuit 40. The MOS transistor 14 performs a reset operation after completion of a readout operation during which the signal voltage from the integration capacitor 12 is read out to an output terminal OUT via the column selection transistor 6.

According to the third modification, advantageous features of the GMI circuit, that is, a reduction effect of the random noise by compression of signal bandwidth and a high amplification factor can be obtained. Therefore, remarkably high sensitivity can be obtained in association with the high sensitivity characteristics of the current readout system. Further, since the amount of the current supplied to the integration capacitor 12 is remarkably reduced, there is an effect that the capacity can significantly be miniaturized.

Figure 12:
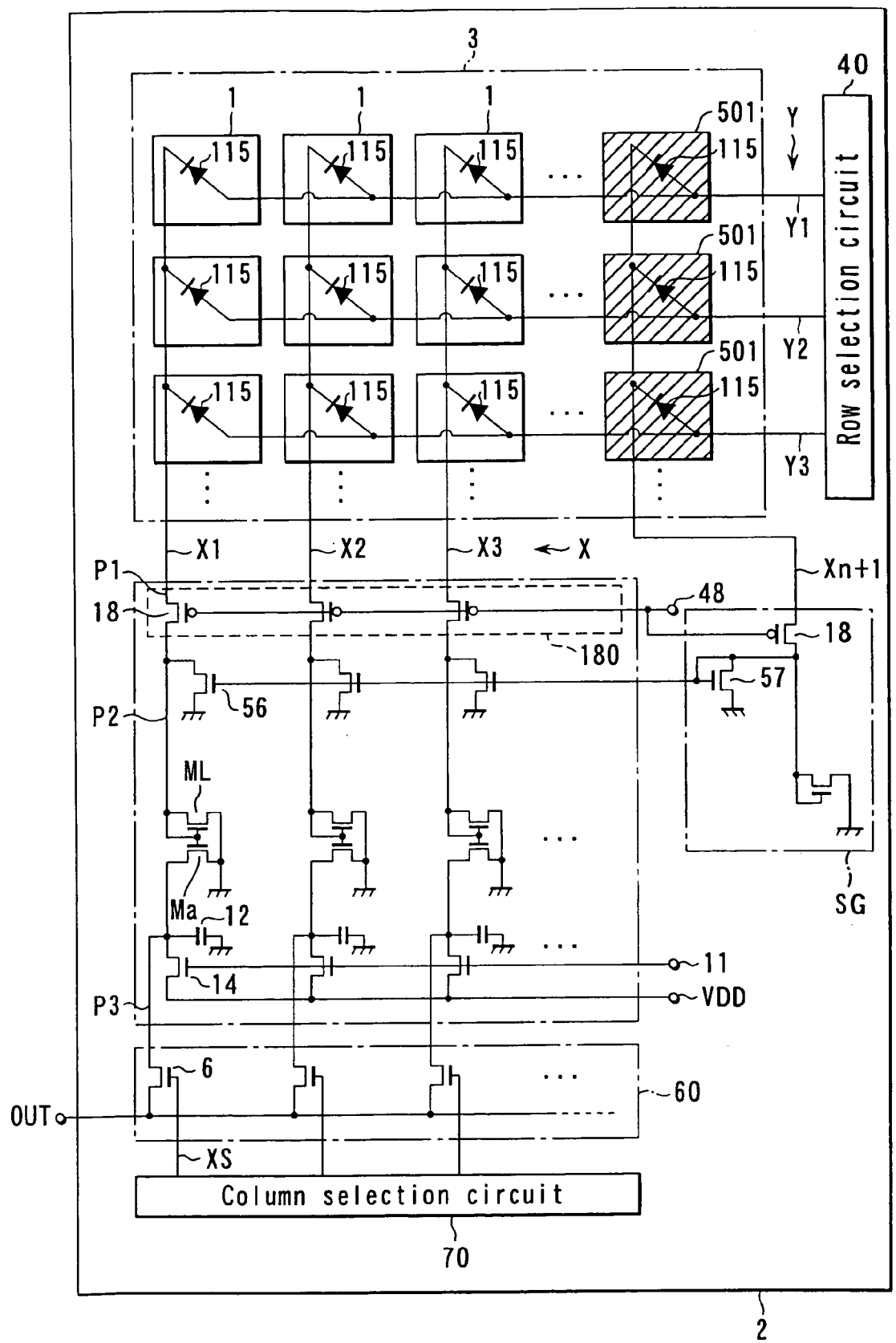
FIG. 12 is a diagram showing the whole configuration of an uncooled solid-state infrared imager according to a fourth embodiment of the present invention.

An uncooled solid-state infrared imager according to a fourth embodiment of the present invention will be described. FIG. 12 shows the whole configuration of the uncooled solid-state infrared imager. The uncooled solid-state infrared imager is similar to that of the second embodiment except that a column of optically non-sensing pixels 501 and an additional signal line Xn+1 are disposed next to the n-th column of the infrared sensing pixels, and the subtraction controller SG refers to an output signal from one of the optically non-sensing pixels 501 so as to produce a voltage signal for subtraction. The signal line Xn+1 is connected to each of the optically non-sensing pixels 501.

Each optically non-sensing pixel 501 includes a heat isolating structure and infrared absorbing structure substantially identical to those of the inferred sensing pixel shown in FIGS. 2A and 2B. In addition to the structures, each optically non-sensing pixel 501 includes an infrared radiation reflective layer 130 masking the infrared absorbing layer 118. The infrared radiation reflective layer 130 contains a metal film such as aluminum. In the optically non-sensing pixel 501, since the incident infrared radiation is reflected by the infrared radiation reflective layer 130, no temperature change is caused by the incident infrared radiation and thus only a signal corresponding to the self-heating effect is output to the signal line Xn+1.

The subtraction controller SG is formed as an optically non-sensing pixel signal voltage generator which causes a non-sensing pixel signal current from the optically non-sensing pixel 501 to flow in a condition substantially equivalent to that of the column amplification circuit 90, and generates a voltage with reference to the signal current. This voltage is supplied to each of the n-channel MOS transistors 56. For example, the subtraction controller SG includes a p-channel MOS transistor 18 and an n-channel MOS transistor 57. The MOS transistors 18 and 57 are connected in series between the signal line Xn+1 and the ground terminal. The gate of the MOS transistor 57 is connected to the source thereof and the gates of the MOS transistors 56 in the column amplifier 90. As a result, the MOS transistors 56 and 57 serve as a current mirror circuit.

According to the fourth embodiment, the non-sensing pixels 501 and the infrared sensing pixels 1 are formed in the common semiconductor substrate 2. Therefore, the temperature of the non-sensing pixel 501 changes due to the self-heating effect in substantially the same tendency as the temperature change of the infrared sensing pixel 1, and a current caused by self-heating flows in the signal line Xn+1. A self-heating component is the major part of the signal current in each of the signal lines X1 to Xn. With current removal circuit which is formed of the n MOS transistors 56 of the column amplification circuit 90 and the MOS transistor 57, a bias current component including the self-heating component is effectively cancelled without requiring any circuit-tuning of voltage or the like. More specifically, each MOS transistor 56 subtracts a bias current component including the self-heating component from the current flowing in a corresponding one of the signal lines X1 to Xn by the control of a voltage generated by the subtraction controller SG with reference to the current flowing in the signal line Xn+1. As a result, the column amplifier 9 amplifies only a signal component of the temperature change caused by the incident infrared radiation.

That is, only the signal component that has no self-heating component is current-amplified, it is possible to enhance the gain. Moreover, the random noise generated by the bandwidth enlargement does not increase. Therefore, an uncooled solid-state infrared imager which has a high sensitivity, low noise, and broad dynamic range can be obtained.

In the case where the column amplification circuit 90 is formed using the circuit shown in FIG. 1, 6, 8, 10, or 11, the subtraction controller SG is changed to have a configuration substantially equivalent to that of the circuit. For example, one or more source follower circuits, at least two even-numbered inverter circuits or the like are provided as a signal output section. As for the operation point, it can be optimized by appropriately adjusting the voltages of H or L levels applied to the source follower circuits, the inverter circuits, or the like.

Figure 13:
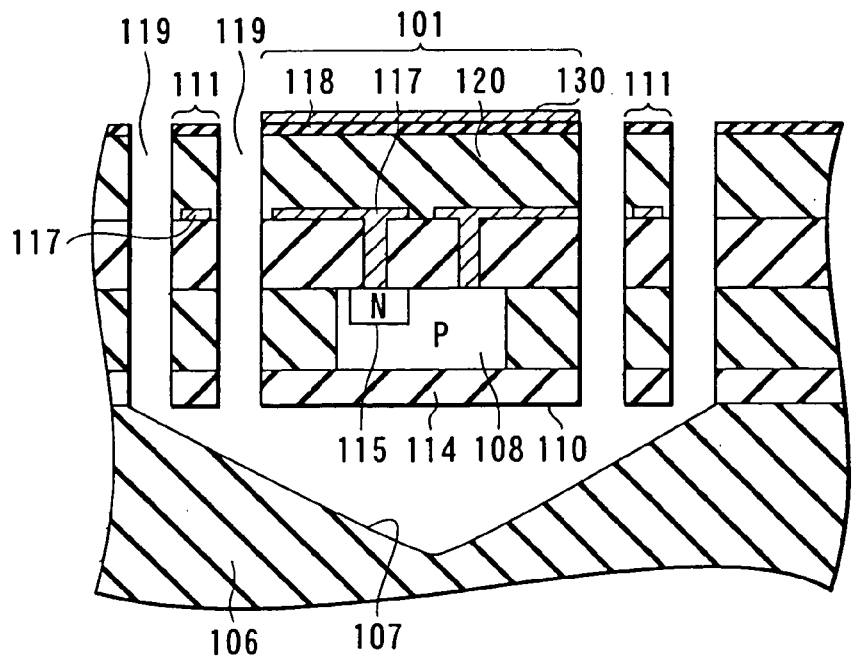
FIG. 13 is a view showing the sectional structure of an optically non-sensing pixel shown in FIG. 12.
Figure 14:
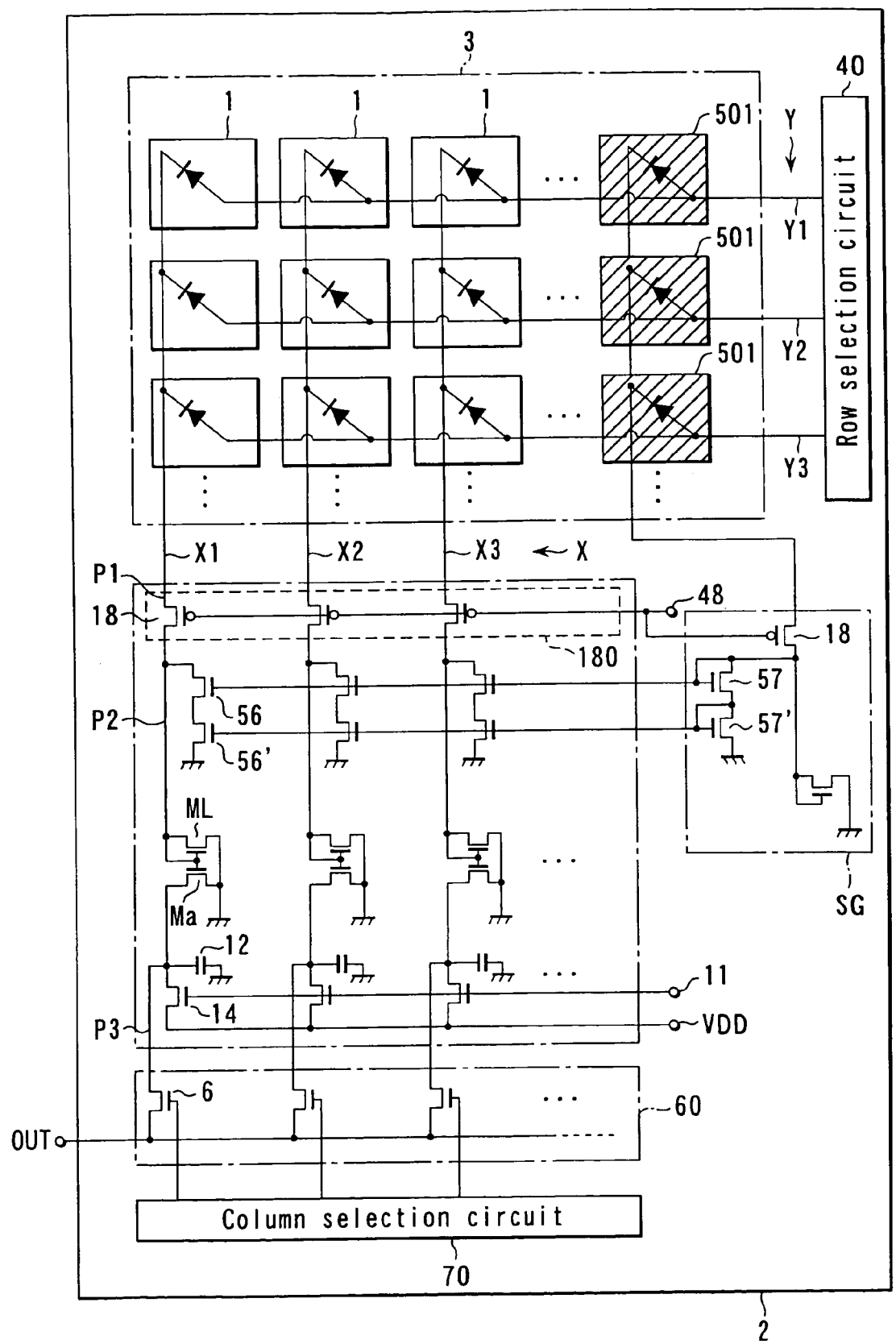
FIG. 14 is a diagram showing a modification of a current removal circuit shown in FIG. 11.

FIG. 14 shows a modification of the current removal circuit shown in FIG. 13. In the modification, MOS transistors 56' are connected in series with the MOS transistors 56 in the column amplification circuit 90, and a MOS transistor 57' is connected in series with the MOS transistor 57 in the subtraction controller SG. The gate of the MOS transistor 57' is connected to the source thereof and the gates of the MOS transistors 56'.

According to the modification, two current mirror circuits are provided in the current removal circuit. Therefore, the accuracy of the current removal circuit can be improved.

Here, the preferred configurations of the components used in the above-described embodiments are as follows.

(1) The non-sensing pixel 501 has a radiation shielding member covering an infrared absorbing structure identical to that of the infrared sensing pixel 1 to achieve the optical non-sensitivity.

(2) The subtraction controller SG is a non-sensing pixel voltage signal generating circuit including at least one source follower circuit to which the voltage output from each non-sensing pixel 501 is input.

(3) The subtraction controller SG is a non-sensing pixel voltage signal generating circuit including at least two even-numbered inverter circuits to which the voltage output from each non-sensing pixel 501 is input.

(4) The column amplification circuit 90 includes at least an operational amplifier 30.

(5) The signal line potential stabilizing circuit 180 includes a MOS transistor having a drain connected to the signal line X and a gate which receives a voltage input for controlling the channel potential thereof to a desired level.

(6) The current-voltage converter of the column amplifier 9 is a circuit including an operational amplifier and an impedance element such as a load resistor or capacitor.

(7) The current-voltage converter of the column amplifier 9 is a circuit including at least an inverter circuit.

(8) The current-voltage converter of the column amplifier 9 is a circuit including at least a source follower circuit.

(9) The current-voltage converter of the column amplifier 9 is a circuit including at least a current integration capacitor and a gate modulation integrator circuit.

(10) The current removal circuit is a current-controllable constant-current circuit which has a current-control input terminal for a desired amount of current control.

(11) The current removal circuit includes a controller which inputs to the current-control input terminal of the current-controllable constant-current circuit a ramp waveform voltage or a step waveform voltage in synchronism with a row selection pulse produced by the row selection circuit 40.

(12) The controller is a voltage generator for generating the ramp or step waveform voltage in synchronization with the row selection pulse from the row selection circuit 40, and is disposed on the semiconductor substrate 2.

(13) The controller is a voltage generator for generating the ramp or step waveform voltage in synchronization with the row selection pulse from the row selection circuit 40, and is disposed outside the semiconductor substrate 2.

(14) The semiconductor substrate is an SOI substrate.

(15) The infrared sensing pixel includes an infrared absorber for absorbing incident infrared radiation to generate heat, and a thermoelectric converter for converting the temperature change due to the heat generated by the infrared absorber to an electric signal. The thermoelectric converter includes a thermoelectric converter having a pn-junction formed in the SOI region of the SOI substrate, and a support member for supporting the thermoelectric converter over a hollow portion formed on the semiconductor substrate 2. The support member includes wirings by which the thermoelectric converter is connected to the row selection line and the signal line.

(16) In the infrared sensing pixel 1, a single pn-junction is formed as the thermoelectric converter element.

Additionally, the present invention is not limited to the above-described embodiments. In the embodiments, the pn-junction diode is described as the thermoelectric converter element, but the present invention is not limited to this, and is applicable to an infrared sensor in which the thermoelectric converter element is formed using a bolometer of vanadium oxide, for example. In this case, needless to say, each pixel requires a selection transistor for selecting the pixel.

Moreover, the signal readout circuit including the signal line potential stabilizer and the current-voltage converter is described in the embodiments. However, the configuration of the signal readout circuit is not limited to this, and can be changed in accordance with specifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A solid-state infrared imager comprising:
    a matrix array of infrared sensing pixels which are formed as an imaging area on a semiconductor substrate and each of which contains a pn-junction thermoelectric converter element to sense incident infrared radiation;
    a plurality of row selection lines each connected to said infrared sensing pixels of a corresponding row;
    a plurality of signal lines each connected to said infrared sensing pixels of a corresponding column;
    a row selection circuit which selects and drives one of said row selection lines; and
    a signal readout circuit which reads out signal currents output to said signal lines from said infrared sensing pixels corresponding to the row selection line driven by said row selection circuit; said signal readout circuit including a signal line potential stabilizer which stabilizes the potential of the signal line to a constant level, a current-voltage converter which converts the signal current flowing in the signal line to a signal voltage, and a current removal circuit which removes an undesired bias current component from the signal current; said signal line potential stabilizer including a potential stabilizing MOS transistor inserted in the signal line, and said current-voltage converter including an integration capacitor connected between said signal line and a ground terminal and a reset MOS transistor connected to said signal line.

2. A solid-state infrared imager comprising:
    a matrix array of infrared sensing pixels which are formed as an imaging area on a semiconductor substrate and each of which contains a pn-junction thermoelectric converter element to sense incident infrared radiation;
    a plurality of row selection lines each connected to said infrared sensing pixels of a corresponding row;
    a plurality of signal lines each connected to said infrared sensing pixels of a corresponding column;
    a row selection circuit which selects and drives one of said row selection lines; and a signal readout circuit which reads out signal currents output to said signal lines from said infrared sensing pixels corresponding to the row selection line driven by said row selection circuit; said signal readout circuit including a signal line potential stabilizer which stabilizes the potential of the signal line to a constant level, a current-voltage converter which converts the signal current flowing in the signal line to a signal voltage, and a current removal circuit which removes an undesired bias current component from the signal current; said signal line potential stabilizer including a potential stabilizing MOS transistor inserted in the signal line, and said current-voltage converter including a current-voltage converting MOS transistor connected between said signal line and a ground terminal, said signal line being connected to a gate of said current-voltage converting MOS transistor and a gate of a current amplifying MOS transistor, and said current-voltage converting MOS transistor serving as a gate modulating integrator circuit in association with an integration capacitor connected between said signal line and a ground terminal and a reset MOS transistor connected to said signal line.

3. A solid-state infrared imager comprising:

a matrix array of infrared sensing pixels which are formed as an imaging area on a semiconductor substrate and each of which contains a pn-junction thermoelectric converter element to sense incident infrared radiation;

a plurality of row selection lines each connected to said infrared sensing pixels of a corresponding row;

a plurality of signal lines each connected to said infrared sensing pixels of a corresponding column;

a row selection circuit which selects and drives one of said row selection lines; and a signal readout circuit which reads out signal currents output to said signal lines from said infrared sensing pixels corresponding to the row selection line driven by said row selection circuit; said signal readout circuit including a signal line potential stabilizer which stabilizes the potential of the signal line to a constant level, a current-voltage converter which converts the signal current flowing in the signal line to a signal voltage, and a current removal circuit which removes an undesired bias current component from the signal current; said signal line potential stabilizer including a potential stabilizing MOS transistor inserted in the signal line, and said current-voltage converter including a circuit of an impedance element and an operational amplifier which serves as said signal line potential stabilizer.

* * * * *